US006881526B2

(12) United States Patent
Bobeck et al.

(10) Patent No.: US 6,881,526 B2
(45) Date of Patent: Apr. 19, 2005

(54) RECEIVER ELEMENT FOR ADJUSTING THE FOCUS OF AN IMAGING LASER

(75) Inventors: John E. Bobeck, Wilmington, DE (US); Richard Albert Coveleskie, Sayre, PA (US); Jeffrey Jude Patricia, Apalachin, NY (US); Alan Lee Shobert, Sayre, PA (US); Harvey Walter Taylor, Jr., Sayre, PA (US); Harry Richard Zwicker, Glen Mills, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/450,757

(22) PCT Filed: Dec. 14, 2001

(86) PCT No.: PCT/US01/48927

§ 371 (c)(1), (2), (4) Date: Jun. 13, 2003

(87) PCT Pub. No.: WO02/47917

PCT Pub. Date: Jun. 20, 2002

(65) Prior Publication Data

US 2004/0048175 A1 Mar. 11, 2004

Related U.S. Application Data

(60) Provisional application No. 60/256,243, filed on Dec. 15, 2000, and provisional application No. 60/266,809, filed on Feb. 6, 2001.

(51) Int. Cl.[7] .......................... G03F 7/34; G03F 7/204; G03F 7/11

(52) U.S. Cl. .......................... 430/30; 430/200; 430/201

(58) Field of Search .......................... 430/30, 200, 201, 430/220

(56) References Cited

U.S. PATENT DOCUMENTS

| | | | | |
|---|---|---|---|---|
| 4,288,524 A | * | 9/1981 | Bilofsky et al. | 430/220 |
| 4,743,091 A | | 5/1988 | Gelbert | |
| 4,788,128 A | | 11/1988 | Barlow | |

(Continued)

FOREIGN PATENT DOCUMENTS

| | | | |
|---|---|---|---|
| EP | 1004454 | A1 | 5/2000 |
| WO | WO 9304390 | A1 | 3/1993 |
| WO | WO 0074940 | A1 | 12/2000 |

*Primary Examiner*—Richard L. Schilling
(74) *Attorney, Agent, or Firm*—Thomas H. Magee

(57) ABSTRACT

A process for adjusting the energy of an imaging laser for imaging of a thermally imageable element including the steps of: (a) providing an imaging unit having a non-imaging laser and an imaging laser, the non-imaging laser having a light detector which is in communication with the imaging laser, (b) contacting a receiver element with the thermally imageable element in the imaging unit, wherein the receiver element comprises a light attenuating layer having a front surface and a back surface; (c) actuating the non-imaging laser to expose the thermally imageable element and the receiver element to an amount of light energy sufficient for the light detector to detect the amount of light reflected from the thermally imageable element and light attenuating layer of the receiver element; and (d) actuating the imaging laser to focus the imaging laser in order to expose the thermally imageable element to an amount of light energy sufficient for imaging the thermally imageable element.

17 Claims, 5 Drawing Sheets

U.S. PATENT DOCUMENTS

| | | | | | |
|---|---|---|---|---|---|
| 4,942,141 | A | | 7/1990 | DeBoer et al. | |
| 4,948,776 | A | | 8/1990 | Evans et al. | |
| 4,948,777 | A | | 8/1990 | Evans et al. | |
| 4,948,778 | A | | 8/1990 | DeBoer | |
| 4,950,639 | A | | 8/1990 | DeBoer et al. | |
| 4,952,552 | A | | 8/1990 | Chapman et al. | |
| 5,019,549 | A | | 5/1991 | Kellogg et al. | |
| 5,085,698 | A | | 2/1992 | Ma et al. | |
| 5,156,938 | A | | 10/1992 | Foley et al. | |
| 5,171,650 | A | | 12/1992 | Ellis et al. | |
| 5,248,992 | A | * | 9/1993 | Ferschl | 347/258 |
| 5,256,506 | A | | 10/1993 | Ellis et al. | |
| 5,278,576 | A | * | 1/1994 | Kaszczuk et al. | 346/135.1 |
| 5,350,733 | A | * | 9/1994 | Campbell et al. | 503/227 |
| 5,517,359 | A | | 5/1996 | Gelbart | |
| 5,534,387 | A | | 7/1996 | Bodager et al. | |
| 5,593,808 | A | | 1/1997 | Ellis | |
| 5,622,795 | A | | 4/1997 | Ellis | |
| 5,681,681 | A | | 10/1997 | Ellis | |
| 5,773,188 | A | | 6/1998 | Ellis | |
| 6,137,580 | A | | 10/2000 | Gelbert | |
| 6,140,009 | A | | 10/2000 | Wolk et al. | |
| 6,645,681 | B1 | * | 11/2003 | Andrews et al. | 430/7 |

* cited by examiner

RECEIVER ELEMENT FOR ADJUSTING THE FOCUS OF AN IMAGING LASER

This application claims the benefit of Provisional application Ser. Nos. 60/256,243, filed Dec. 15, 2000; and 60/266,809, filed Feb. 6, 2001.

FIELD OF THE INVENTION

This invention relates to processes and products for effecting laser-induced thermal transfer imaging. More specifically, the invention relates to a modified receiver element and its use in adjusting the focus of the imaging laser for imaging thermally imageable elements.

BACKGROUND OF THE INVENTION

Laser-induced thermal transfer processes are well-known in applications such as color proofing, electronic circuits, and lithography. Such laser-induced processes include, for example, dye sublimation, dye transfer, melt transfer, and ablative material transfer.

Laser-induced processes use a laserable assemblage comprising: (a) a thermally imageable element that contains a thermally imageable layer, the exposed areas of which are transferred, and (b) a receiver element having an image receiving layer that is in contact with the thermally imageable layer. The laserable assemblage is imagewise exposed by a laser, usually an infrared laser, resulting in transfer of exposed areas of the thermally imageable layer from the thermally imageable element to the receiver element. The (imagewise) exposure takes place only in a small, selected region of the laserable assemblage at one time, so that transfer of material from the thermally imageable element to the receiver element can be built up one pixel at a time. Computer control produces transfer with high resolution and at high speed.

The equipment used to image thermally imageable elements is comprised of an imaging laser, and a non-imaging laser, wherein the non-imaging laser has a light detector which is in communication with the imaging laser. Since the imaging and non-imaging lasers have emissions at different wavelengths, problems occur with the focus of the imaging laser.

A need exists for a process for adjusting the focus of the imaging laser for imaging a thermally imageable element.

SUMMARY OF THE INVENTION

The invention provides a thermal imaging process that uses modified receiver elements that allow for the adjusting of the focus of an imaging laser in imaging thermally imageable elements. The invention modifies the imaging latitude of the thermally imageable element by facilitating laser focus and imaging from color to color.

This invention relates to a process for adjusting the focus of an imaging laser for imaging a thermally imageable element comprising the steps of:

(a) providing an imaging unit having a non-imaging laser and an imaging laser, the non-imaging laser having a light detector which is in communication with the imaging laser;

(b) contacting a receiver element with the thermally imageable element in the imaging unit, wherein the receiver element comprises an image receiving layer and a light attenuating layer;

(c) actuating the non-imaging laser to expose the thermally imageable element and the receiver element to an amount of light energy sufficient for the light detector to detect the amount of light reflected from the thermally imageable element and the light attenuating layer of the receiver element; and (d) actuating the imaging laser to properly focus the imaging laser in order to expose the thermally imageable element to an amount of light energy sufficient for imaging the thermally imageable element, the focus of light energy being determined by the amount of light reflected from the thermally imageable element and the light attenuating layer and communicated to the imaging laser by the light detector.

The light attenuating layer may be any layer of the receiver such as the receiver support, a release layer or a cushion layer or the image receiving layer.

The light attenuating agent may be selected from an absorber, a diffuser and mixtures thereof.

The process further comprising the steps of:

(a) imaging the thermally imageable element for form imaged and non-imaged areas; and (b) separating the imaged thermally imageable element from the receiver element to form an image on the receiver element.

FIG. **2*a* illustrates a receiver element (20*a*) of this invention, optionally having a roughened surface, having a receiver support (21), an optional release layer or cushion layer (23) and a image receiving layer (22)**, wherein either the receiver support, the release or cushion layer, or the image receiving layer contain a light attenuating agent.

Figure 3:
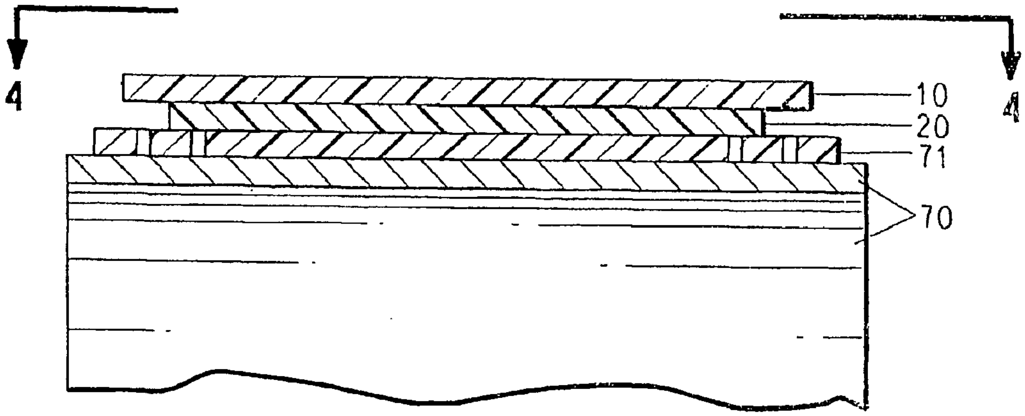
Figure 4:
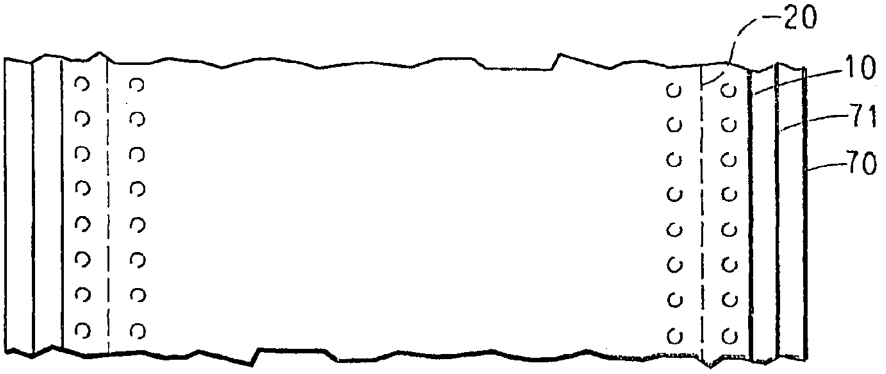

FIGS. 3 and 4 illustrate the positioning of the thermally imageable element (10), the receiver element having a light attenuating layer (20), and the optional carrier element 71 on drum (70) prior to vacuum drawdown and laser imaging.

Figure 5:
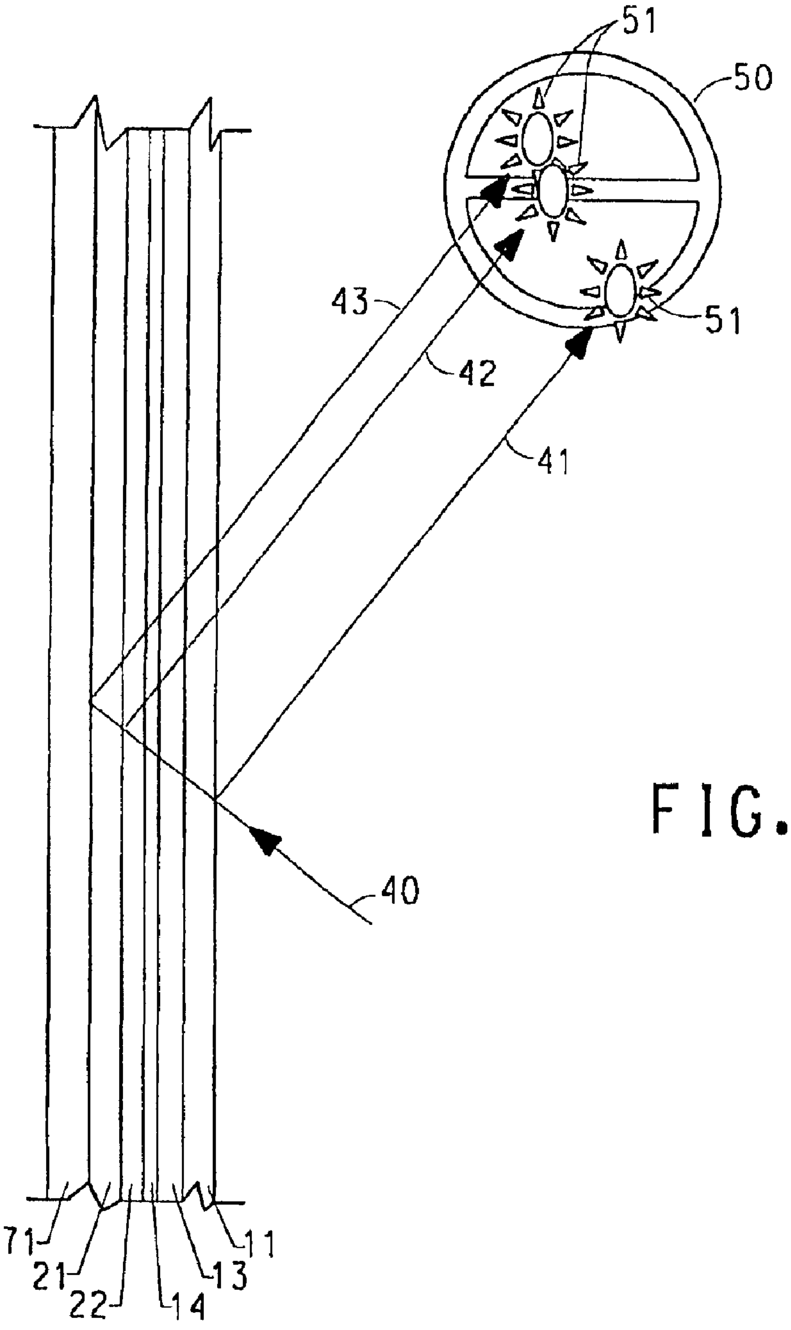

FIG. 5 illustrates a non-imaging autofocus probe beam light as it is reflected from key surfaces of the thermally imageable element and the receiver element and a carrier element wherein the receiver element does not contain a light attenuating layer.

Figure 6:
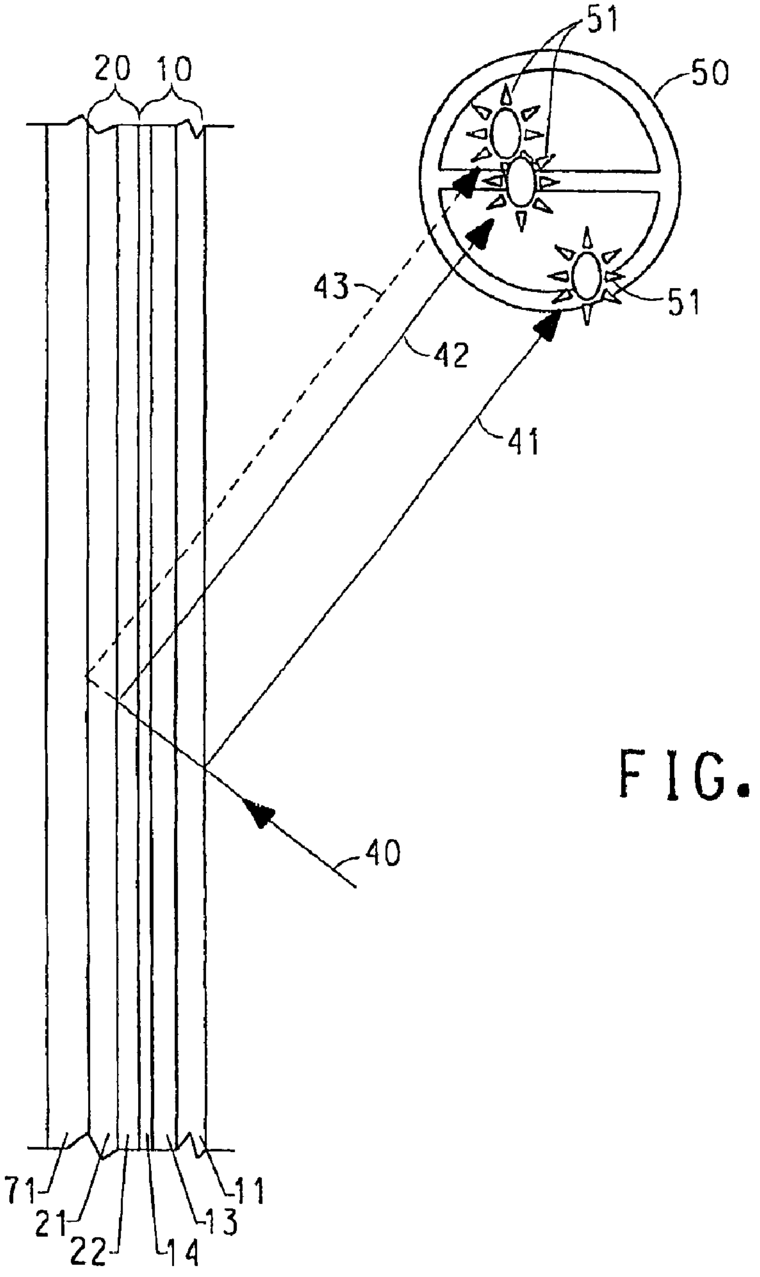

FIG. 6 illustrates a non-imaging autofocus probe beam light as it is reflected from key surfaces of the thermally imageable element, the receiver element and the carrier element, wherein the receiver element contains a light attenuating layer wherein the light attenuating layer contains an absorber.

Figure 7:
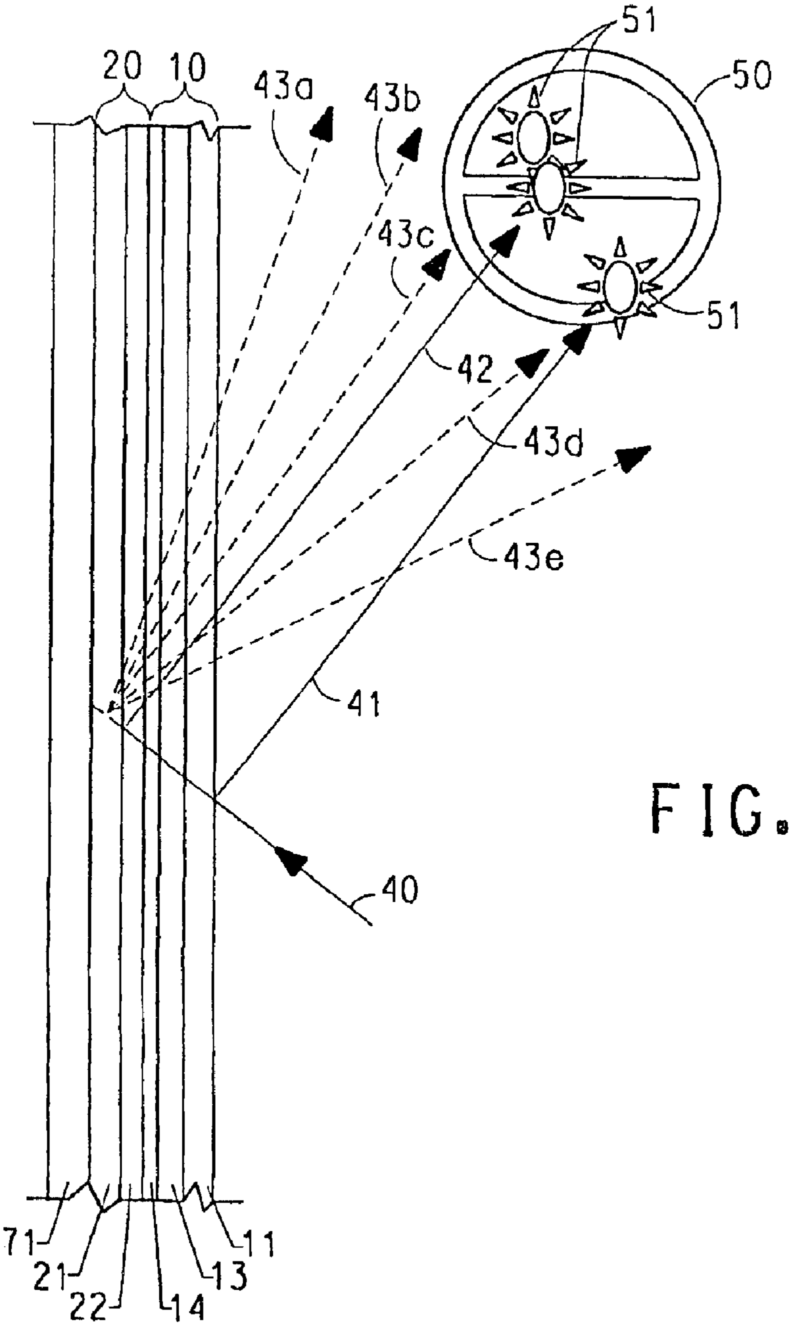

FIG. 7 illustrates non-imaging autofocus probe beam light as it is reflected from key surfaces of the thermally imageable element, and the receiver element, wherein the receiver element contains a light attenuating layer, and wherein the light layer contains a diffuser.

DETAILED DESCRIPTION OF THE INVENTION

Processes and products for laser induced thermal transfer imaging are disclosed wherein receiver elements provide modified imaging characteristics.

Before the processes of this invention are described in further detail, several different exemplary laserable assemblages made up of the combination of a receiver element, optionally having a roughened surface and a thermally imageable element will be described. The processes of this invention are fast and are typically conducted using one of these exemplary laserable assemblages.

Thermally Imageable Element

Figure 1:
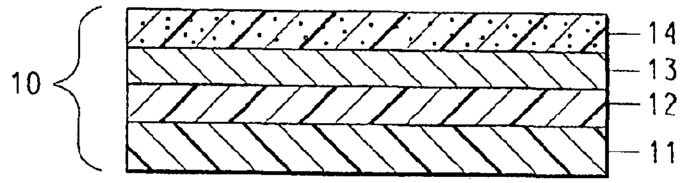
FIG. 1 illustrates a thermally imageable element (10) useful in the invention having a support (11); a base element having a coatable surface comprising an optional ejection layer or subbing layer (12) an optional heating layer (13), and a thermally imageable layer (14).

As shown in FIG. 1, an exemplary thermally imageable element useful for thermal imaging in accordance with the processes of this invention comprises thermally imageable layer, and typically for a color proofing application a thermally imageable colorant-containing layer (14) and a base element having a coatable surface which comprises an optional ejection layer or subbing layer (12) and a heating layer (13). Each of these layers has separate and distinct functions. Optionally, a support for the thermally imageable element (11) may also be present. In one embodiment, the heating layer (13) may be present directly on the support (11).

The thermally imageable element may be simply a laser imageable element for a laser imaging process capable of imaging an imageable element as described herein by non-thermal methods.

Base Element:

Typically, the base element (12) is a thick (400 gauge) coextruded polyethylene terephthalate film. Alternately, the base element can be a polyester film, specifically polyethylene terephthalate that has been plasma treated to accept the heating layer such a the Melinex® line of polyester films made by DupontTeijinFilms™ a joint venture of DuPont and Teijin Limited. When the base element is plasma treated, a subbing layer or ejection layer is usually not provided on the support. Backing layers may optionally be provided on the support. These backing layers may contain fillers to provide a roughened surface on the back side of the base element, i.e. the side opposite from the base element (12). Alternatively, the base element itself may contain fillers, such as silica, to provide a roughened surface on the back surface of the base element. Alternately, the base element may be physically roughened to provide a roughened surface on one or both surfaces of the base element said roughening being sufficient to scatter the light emitted from the non-imaging laser. Some examples of physical roughening methods include sandblasting, impacting with a metal brush, etc. If a support is employed it may be the same or different from the base element. Typically, the support is a thick polyethylene terephthalate film.

Ejection or Subbing Layer:

The optional ejection layer, which is usually flexible, or optional subbing layer, which may be on one side of the base element (12), as shown in FIG. 1, is the layer that provides the force to effect transfer of the thermally imageable colorant-containing layer to the receiver element in the exposed areas. When heated, this layer decomposes into gaseous molecules providing the necessary pressure to propel or eject the exposed areas of the thermally imageable colorant-containing layer onto the receiver element. This is accomplished by using a polymer having a relatively low decomposition temperature (less than about 350° C., typically less than about 325° C., and more typically less than about 280° C.). In the case of polymers having more than one decomposition temperature, the first decomposition temperature should be lower than 350° C. Furthermore, in order for the ejection layer to have suitably high flexibility and conformability, it should have a tensile modulus that is less than or equal to about 2.5 Gigapascals (GPa), specifically less than about 1.5 GPa, and more specifically less than about 1 Gigapascal (GPa). The polymer chosen should also be one that is dimensionally stable. If the laserable assemblage is imaged through the ejection layer, the ejection layer should be capable of transmitting the laser radiation, and not be adversely affected by this radiation.

Examples of suitable polymers for the ejection layer include (a) polycarbonates having low decomposition temperatures (Td), such as polypropylene carbonate; (b) substituted styrene polymers having low decomposition temperatures, such as poly(alpha-methylstyrene); (c) polyacrylate and polymethacrylate esters, such as polymethylmethacrylate and polybutylmethacrylate; (d) cellulosic materials having low decomposition temperatures (Td), such as cellulose acetate butyrate and nitrocellulose; and (e) other polymers such as polyvinyl chloride; poly(chlorovinyl chloride) polyacetals; polyvinylidene chloride; polyurethanes with low Td; polyesters; polyorthoesters; acrylonitrile and substituted acrylonitrile polymers; maleic acid resins; and copolymers of the above. Mixtures of polymers can also be used. Additional examples of polymers having low decomposition temperatures can be found in U.S. Pat. No. 5,156,938. These include polymers which undergo acid-catalyzed decomposition. For these polymers, it is frequently desirable to include one or more hydrogen donors with the polymer.

Specific examples of polymers for the ejection layer are polyacrylate and polymethacrylate esters, low Td polycarbonates, nitrocellulose, poly(vinyl chloride) (PVC), and chlorinated poly(vinyl chloride) (CPVC). Most specifically are poly(vinyl chloride) and chlorinated poly(vinyl chloride).

Other materials can be present as additives in the ejection layer as long as they do not interfere with the essential function of the layer. Examples of such additives include coating aids, flow additives, slip agents, antihalation agents, plasticizers, antistatic agents, surfactants, and others which are known to be used in the formulation of coatings.

Alternately, a subbing layer may optionally be applied onto the base element (12) in place of the ejection layer resulting in a thermally imageable element having in order at least one subbing layer on one side of the base element (12), at least one heating layer (13), and at least one thermally imageable colorant-containing layer (14). Some suitable subbing layers include polyurethanes, polyvinyl chloride, cellulosic materials, acrylate or methacrylate homopolymers and copolymers, and mixtures thereof. Other custom made decomposable polymers may also be useful in the subbing layer. Specifically useful as subbing layers for polyester, specifically polyethylene terephthalate, are acrylic subbing layers. The subbing layer may have a thickness of about 100 to about 1000 A.

Heating Layer

The optional heating layer (13), as shown in FIG. 1, is deposited on the flexible ejection or subbing layer. The function of the heating layer is to absorb the laser radiation and convert the radiation into heat. Materials suitable for the layer can be inorganic or organic and can inherently absorb the laser radiation or include additional laser-radiation absorbing compounds.

Examples of suitable inorganic materials are transition metal elements and metallic elements of Groups IIIA, IVA, VA, VIA, VIIIA, IIB, IIIB, and VB of the Period Table of the Elements (Sargent-Welch Scientific Company (1979)), their alloys with each other, and their alloys with the elements of Groups IA and IIA. Tungsten (W) is an example of a Group VIA metal that is suitable and which can be utilized. Carbon (a Group IVB nonmetallic element) can also be used. Specific metals include Al, Cr, Sb, Ti, $Bi_4$, Zr, Ni, In, Zn, and their alloys and oxides. $TiO_2$ may be employed as the heating layer material.

The thickness of the heating layer is generally about 10 Angstroms to about 0.1 micrometer, more specifically about 20 to about 60 Angstroms.

Although it is typical to have a single heating layer, it is also possible to have more than one heating layer, and the different layers can have the same or different compositions, as long as they all function as described above. The total thickness of all the heating layers should be in the range given above.

The optical density of the heating layer at the wavelength of the non-imaging laser is typically in the order of greater than about 0.1, and less than about 1.0 transmission density.

The heating layer(s) can be applied using any of the well-known techniques for providing thin metal layers, such as sputtering, chemical vapor deposition, and electron beam.

Thermally Imageable Layer:

The thermally imageable layer, which for a color proofing application is typically a thermally imageable colorant-containing layer (14) is formed by applying a thermally imageable composition, typically containing a colorant, to a base element. For other examples, such as electronic circuit applications, the thermally imageable layer may not contain a colorant. For electronic applications the thermally imageable layer may contain electronically active conductors, insulators, semiconductors, or precursors to these functions.

For the color proofing application, the colorant-containing layer comprises (i) a polymeric binder which is different from the polymer in the ejection layer, and (ii) a colorant comprising a dye or a pigment dispersion.

The binder for the colorant-containing layer is usually a polymeric material having a decomposition temperature that is greater than about 250° C. and specifically greater than about 350° C. The binder should be film forming and coatable from solution or from a dispersion. Binders having melting points less than about 250° C. or plasticized to such an extent that the glass transition temperature is less than about 70° C. are typical. However, heat-fusible binders, such as waxes should be avoided as the sole binder since such binders may not be as durable, although they are useful as cobinders in decreasing the melting point of the top layer.

It is typical that the binder polymer does not self-oxidize, decompose or degrade at the temperature achieved during the laser exposure so that the exposed areas of the thermally imageable layer comprising colorant and binder, are transferred intact for improved durability. Examples of suitable binders include copolymers of styrene and (meth)acrylate esters, such as styrene/methyl-methacrylate; copolymers of styrene and olefin monomers, such as styrene/ethylene/butylene; copolymers of styrene and acrylonitrile; fluoropolymers; copolymers of (meth)acrylate esters with ethylene and carbon monoxide; polycarbonates having higher decomposition temperatures; (meth)acrylate homopolymers and copolymers; polysulfones; polyurethanes; polyesters. The monomers for the above polymers can be substituted or unsubstituted. Mixtures of polymers can also be used.

Specific binder polymers for the thermally imageable layer include, but are not limited to, acrylate homopolymers and copolymers, methacrylate homopolymers and copolymers, (meth)acrylate block copolymers, and (meth) acrylate copolymers containing other comonomer types, such as styrene.

The binder polymer generally has a concentration of about 15 to about 50% by weight, based on the total weight of the colorant-containing layer, specifically about 30 to about 40% by weight.

The colorant of the thermally imageable layer may be an image forming pigment which is organic or inorganic. Examples of suitable inorganic pigments include carbon black and graphite. Examples of suitable organic pigments include color pigments such as Rubine F6B (C.I. No. Pigment 184); Cromophthal® Yellow 3G (C.I. No. Pigment Yellow 93); Hostaperm® Yellow 3G (C.I. No. Pigment Yellow 154); Monastral® Violet R (C.I. No. Pigment Violet 19); 2,9-dimethylquinacridone (C.I. No. Pigment Red 122); Indofast® Brilliant Scarlet R6300 (C.I. No. Pigment Red 123); Quindo Magenta RV 6803; Monastral® Blue G (C.I. No. Pigment Blue 15); Monastral® Blue BT 383D (C.I. No. Pigment Blue 15); Monastral® Blue G BT 284D (C.I. No. Pigment Blue 15); and Monastral® Green GT 751 D (C.I. No. Pigment Green 7). Combinations of pigments and/or dyes can also be used. For color filter array applications, high transparency pigm nts (that is at least about 80% of light transmits through the pigment) are typical, having small particl size (that is about 100 nanometers).

In accordance with principles well known to those skilled in the art, the concentration of pigment will be chosen to achieve the optical density desired in the final image. The amount of pigment will depend on the thickness of the active coating and the absorption of the colorant. Optical densities greater than 1.3 at the wavelength of maximum absorption are typically required. Even higher densities are typical. Optical densities in the 2–3 range or higher are achievable with application of this invention.

The optical density of the pigmented layer at the wavelength of the non-imaging laser may be in the range from greater than about 0.01 to less than about 5.0 transmission density, more typically in the order of about 0.2 to about 3.0 transmission density. This density may not be controlled in selection of the colorants, but the non-imaging laser must be able to accommodate at least this range of optical properties.

A dispersant is usually used in combination with the pigment in order to achieve maximum color strength, transparency and gloss. The dispersant is generally an organic polymeric compound and is used to separate the fine pigment particles and avoid flocculation and agglomeration of the particles. A wide range of dispersants is commercially available. A dispersant will be selected according to the characteristics of the pigment surface and other components in the composition as known by those skilled in the art. However, one class of dispersant suitable for practicing the invention is that of the AB dispersants. The A segment of the dispersant adsorbs onto the surface of the pigment. The B segment extends into the solvent into which the pigment is dispersed. The B segment provides a barrier between pigment particles to counteract the attractive forces of the particles, and thus to prevent agglomeration. The B segment should have good compatibility with the solvent used. The AB dispersants of utility are generally described in U.S. Pat. No. 5,085,698. Conventional pigment dispersing techniques, such as ball milling, sand milling, etc., can be employed.

The pigment can be present in an amount of from about 25 to about 95% by weight, typically about 35 to about 65% by weight, based on the total weight of the composition of the colorant-containing layer.

Although the above discussion was directed to color proofing, the element and process of the invention apply equally to the transfer of other types of materials in different applications. In general, the scope of the invention is intended to include any application in which solid material is to be applied to a receptor in a pattern.

The thermally imageable layer may be coated on the base element from a solution in a suitable solvent, however, it is typical to coat the layer(s) from a dispersion. Any suitable solvent can be used as a coating solvent, as long as it does not deleteriously affect the properties of the assemblage, using conventional coating techniques or printing techniques, for example, gravure printing. A typical solvent is water. The thermally imageable layer may be applied by a coating process accomplished using the WaterProof® Color Versatility Coater sold by DuPont, Wilmington, Del. Coating of the colorant-containing layer can thus be achieved shortly before the exposure step. This also allows for the mixing of various basic colors together to fabricate a wide variety of colors to match the Pantone® color guide currently used as one of the standards in the proofing industry.

Thermal Amplification Additive

A thermal amplification additive is typically present in the thermally imageable layer, but may also be present in the ejection layer(s) or subbing layer.

The function of the thermal amplification additive is to amplify the effect of the heat generated in the heating layer and thus to further increase sensitivity to the laser. This additive should be stable at room temperature. The additive can be (1) a decomposing compound which decomposes when heated, to form gaseous by-products(s), (2) an absorbing dye which absorbs the incident laser radiation, or (3) a compound which undergoes a thermally induced unimolecular rearrangement which is exothermic. Combinations of these types of additives may also be used.

Decomposing compounds of group (1) include those which decompose to form nitrogen, such as diazo alkyls, diazonium salts, and azido (—N3) compounds; ammonium salts; oxides which decompose to form oxygen; carbonates or peroxides. Specific examples of such compounds are diazo compounds such as 4-diazo-N,N' diethyl-aniline fluoroborate (DAFB). Mixtures of any of the foregoing compounds can also be used.

An absorbing dye of group (2) is typically on that absorbs in the infrared region. Examples of suitable near infrared absorbing NIR dyes which can be used alone or in combination include poly(substituted) phthalocyanine compounds and metal-containing phthalocyanine compounds; cyanine dyes; squarylium dyes; chalcogenopyryioacrylidene dyes; croconium dyes; metal thiolate dyes; bis(chalcogenopyrylo) polymethine dyes; oxyindolizine dyes; bis(aminoaryl) polymethine dyes; merocyanine dyes; and quinoid dyes. When the absorbing dye is incorporated in the ejection or subbing layer, its function is to absorb the incident radiation and convert this into heat, leading to more efficient heating. It is typical that the dye absorb in the infrared region. For imaging applications, it is also typical that the dye have very low absorption in the visible region.

Absorbing dyes also of group (2) include the infrared absorbing materials disclosed in U.S. Pat. Nos. 4,778,128; 4,942,141; 4,948,778; 4,950,639; 5,019,549; 4,948,776; 4,948,777 and 4,952,552.

When present in the thermally imageable layer, the thermal amplification weight percentage is generally at a level of about 0.95-about 11.5%. The percentage can range up to about 25% of the total weight percentage in the colorant-containing layer. These percentages are non-limiting and one of ordinary skill in the art can vary them depending upon the particular composition of the layer.

The thermally imageable layer generally has a thickness in the range of about 0.1 to about 5 micrometers, typically in the range of about 0.1 to about 1.5 micrometers. Thicknesses greater than about 5 micrometers are generally not useful as they require excessive energy in order to be effectively transferred to the receiver.

Although it is typical to have a single thermally imageable layer, it is also possible to have more than one thermally imageable layer, and the different layers can have the same or different compositions, as long as they all function as described above. The total thickness of the combined thermally imageable layers are usually in the range given above.

Additional Additives

Other materials can be present as additives in the thermally imageable layer as long as they do not interfere with the essential function of the layer. Examples of such additives include stabilizers, coating aids plasticizers, flow additives, slip agents, antihalation agents, antistatic agents, surfactants, and others which are known to be used in the formulation of coatings. However, it is typical to minimize the amount of additional materials in this layer, as they may deleteriously affect the final product after transfer. Additives may add unwanted color for color proofing applications, or they may decrease durability and print life in lithographic printing applications.

Additional Layers:

The thermally imageable element may have additional layers. For example, an antihalation layer may be used on the side of the flexible ejection layer opposite the colorant-containing layer. Materials which can be used as antihalation agents are well known in the art. Other anchoring or subbing layers can be present on either side of the flexible ejection layer and are also well known in the art.

In some embodiments of this invention, a material functioning as a heat absorber and a colorant is present in a single layer, termed the top layer. Thus the top layer has a dual function of being both a heating layer and a colorant-containing layer. The characteristics of the top layer are the same as those given for the colorant-containing layer. A typical material functioning as a heat absorber and colorant is carbon black.

Yet additional thermally imageable elements may comprise alternate colorant-containing layer or layers on a support. Additional layers may be present depending of the specific process used for imagewise exposure and transfer of the formed images. Some suitable thermally imageable elements are disclosed in U.S. Pat. No. 5,773,188, U.S. Pat. No. 5,622,795, U.S. Pat. No. 5,593,808, U.S. Pat. No. 5,156,938, U.S. Pat. No. 5,256,506, U.S. Pat. No. 5,171,650 and U.S. Pat. No. 5,681,681.

Receiver Element

Figure 2:
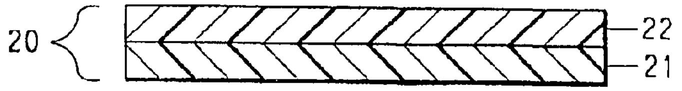
FIG. 2 illustrates a receiver element (20), optionally having a roughened surface, useful in the invention having a receiver support (21) and a image receiving layer (22), wherein either the receiver support or the image receiving layer contain a light attenuating agent.
Figure 2A:
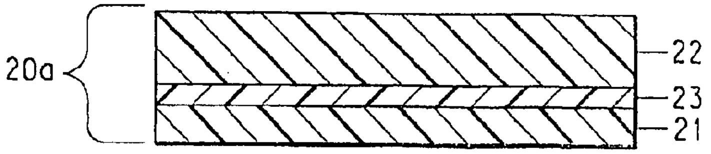

The receiver element (20 and 20*a*), shown in FIGS. 2 and 2*a*, is the part of the laserable assemblage, to which the exposed areas of the thermally imageable layer, typically comprising a polymeric binder and a pigment, are transferred. In most cases, the exposed areas of the thermally imageable layer will not be removed from the thermally imageable element in the absence of a receiver element. That is, exposure of the thermally imageable element alone to laser radiation does not cause material to be removed, or transferred. The exposed areas of the thermally imageable layer, are removed from the thermally imageable element only when it is exposed to laser radiation and the thermally imageable element is in contact with or adjacent to the receiver element. In one embodiment, the thermally imageable element actually touches the surface of the image receiving layer of the receiver element.

The receiver element (20 and 20*a*) may be non-photosensitive or photosensitive. It has a light attenuating layer. The light attenuating layer may be any layer in the receiver element. However, it is preferred that the light attenuating layer be a layer that does not end up in the final product, i.e. it is a layer that is removed prior to the final product being completed. The light attenuating layer comprises a light attenuating agent. If the light attenuating agent is in the image receiving layer it can be bleached prior to the final element being prepared. Additionally, the light attenuating agent may also be in a backing or subbing layer associated with the receiver support.

The light attenuating agent may be selected from the group consisting of an absorber, a diffuser, and mixtures thereof. Depending on the range at which the non-imaging laser operates, such as about 300 nm to about 1500 nm, the absorbers and diffusers should be selected to operate in the same range. Depending on the wavelength range at which the imaging laser operates, which can be from about 300 nm to about 1500 nm, the absorbers and diffusers can be inoperable in the same range. For example, if the non-imaging laser operates in about the 670 nm region and the imaging laser at 830 nm, it is preferred that the absorbers and diffusers operate to absorb or diffuse light in the 670 nm region and the ability of these materials to absorb or diffuse light at 830 nm can be poor. Some examples of light absorbers include any blue phthalocyanine pigments with significant absorption in about the 670 nm range and minimal absoption at 830 nm; such as C.I. Pigment Blue 15 or 15-3, and universally absorbing black pigments such as any carbon black. Some examples of light diffusers are materials which scatter light or scatter and absorb light. They can include white pigments such as titanium dioxide, or combinations (extensions) of white pigments such as: titanium dioxide, barium sulfate, calcium carbonate, oxides, sulfates, carbonates of silicon (i.e. silicon dioxide) and magnesium, etc. Commercial examples of white pigments would include DuPont's TiPure® grades of titanium dioxide. Carbon black examples include any Monarch®, Regal®, Elftex® or Sterling® carbon blacks from Cabot Corporation, Boston, Mass. Blue pigment examples would be the Sunfast® blu pthalocyanine pigment. 15-3 series from Sun Chemical Corporation, Cincinnati, Ohio.

Typically, the light attenuating agent may be added in the form of a pigment chip comprising a resin, for example, an ethylene vinyl acetate resin, and a pigment or mixture of pigments, usually blue or white. Typically, a white pigment chip may comprise about 93 to about 97% of a resin and about 3 to about 7% pigment, more typically about 95% ethylene vinyl acetate and 5% rutile titanium dioxide. Typically, a blue pigment chip may comprise about 98 to about 99% of a resin and about 1 to about 2% pigment, more typically about 98% ethylene vinyl acetate and about 2% blue pigment. A useful blue pigment is C.I. Pigment Blue 15:3 (see NPIRI raw materials Data Handbook, Vol. 4). A typical commercially available blue pigment of this kind is Phthalocyanine Pigment Blue 15:3 sold by Sun Chemical is Phthalocyanine Beta Blue 15:3 sold by Aakash Pigments, Ltd. Mixtures of the white pigment chips in the amounts of about 70 to about 99.5%, more typically about 95–99.5%, and still more typically about 98.75%, and blue pigment chips in the amounts of about 30 to about 0.5%, more typically about 5 to about 0.5%, and still more typically about 1.25% may be used. The mixture comprising the most typical amounts for the white and blue pigment chips may result in a color space represented by an L* of about 80.00 to about 90.00, a* of about −5.00 to about −25.00, b* of about −5.00 to about −25.00.

The use of dyes or combinations of dyes could also conceivably be employed to affect the imaging properties of the herein described thermal imaging system. To one skilled in the art, combinations of blue, red and green dyes could be substituted for pigments. However, a disadvantage in using dyes is the lack of light fastness and migratory tendencies.

The non-photosensitive receiver element usually comprises a receiver support (21) and an image receiving layer (22). Preferably, the receiver support contains the light attenuating agent. The receiver support (21) comprises a dimensionally stable sheet material. The assemblage can be imaged through the receiver support if that support is transparent. Examples of transparent films for receiver supports include, for example polyethylene terephthalate, polyether sulfone, a polyimide, a poly(vinyl alcohol-co-acetal), polyethylene, or a cellulose ester, such as cellulose acetate. Examples of opaque support materials include, for example, polyethylene terephthalate filled with a white pigment such as titanium dioxide, ivory paper, or synthetic paper, such as Tyvek® spunbonded polyolefin. Paper supports are typical for proofing applications, while a polyester support, such as poly(ethylene terephthalate) is typical for a medical hardcopy and color filter array applications.

Typically, when the light attenuating agent is used in the receiver support it is incorporated by compounding with the thermoplastic composition of the support. To those skilled in the art, the compounding techniques can range from the use of Banbury mixers or two roll mills, melt extrusion via a single/twin screw extrusion equipment or solvent dispersion with high shear mixing. All these compounding techniques could be used; however, the preferred method for its ease and simplicity is melt extrusion.

Alternatively, the light attenuated layer can be applied as a layer of the receiver by coating techniques. The coating composition can comprise a dispersion of the light attenuating agent in a binder. A suitable binder can be polymeric and can be the same as the binders employed in the thermally imageable layer or the image receiving layer, whether or not it is photosensitive. A minor amount of a surfactant can also be employed. Typically, the binder is a copolymer of methylmethacrylate and n-butylmethacrylate and the surfactant is a fluoropolymer. Usually, the components of the light attenuated layer are mixed into an aqueous dispersion which is applied as a coating by conventional techniques and dried.

The amount of the light attenuating agent in the light attenuated layer is used in an amount effective to absorb or diffuse the light from the non imaging laser. When the light attenuated layer is made from a coatable composition, the proportion of the polymer used can be the same as that used in the thermally imageable layer. The light attenuating agent is used in the light attenuated layer in an amount sufficient to achieve and absorbance ranging from about 0.1 to about 2.0, typically from about 0.3 to about 0.9 even more typically about 0.6. The absorbance is a dimensionless figure which is well known in the art of spectroscopy. Beyond 2.0 the bas is likely to be too highly absorbing for the imaging process and below 0.1 there might not be sufficient attenuating effect.

Roughened supports may also be used in the receiver element.

The image receiving layer (22) may comprise one or more layers wherein optionally the outermost layer is comprised of a material capable of being micro-roughened. Some examples of materials that are useful include a polycarbonate; a polyurethane; a polyester; polyvinyl chloride; styrene/acrylonitrile copolymer; poly(caprolactone); poly(vinylacetate), vinylacetate copolymers with ethylene and/or vinyl chloride; (meth)acrylate homopolymers (such as butyl-methacrylate) and copolymers; and mixtures thereof. Typically the outermost image receiving layer is a crystalline polymer or poly(vinylacetate) layer. The crystalline image receiving layer polymers, for example, polycaprolactone polymers, typically have melting points in the range of about 50 to about 64° C., more typically about 56 to about 64° C., and most typically about 58 to about 62° C. Blends made from 5–40% Capa® 650 (melt range 58–60° C.) and Tone® P-300 (melt range 58–62° C.), both polycaprolactones, are particularly useful as the outermost layer in this invention. Typically, 100% of CAPA 650 or Tone P-300 is used. However, thermoplastic polymers, such as polyvinyl acetate, have higher melting points (softening point ranges of about 100 to about 180° C.). Image receiving layers may contain the light attenuating agent, but since the image receiving layer ends up as part of the final image this embodiment is not preferred. Useful receiver elements are also disclosed in U.S. Pat. No. 5,534,387 wherein an outermost layer optionally capable of being micro-roughened, for example, a polycaprolactone or poly(vinylacetate) layer is present on the ethylene/vinyl acetate copolymer layer disclosed therein and one of the layers contains a light attenuating agent. The ethylene/vinyl acetate copolymer layer thickness can range from about 0.5 to about 5 mils and the polycaprolactone layer thickness from about 2 to about 100 $mg/dm^2$. Typically, the ethylene/vinyl acetate copolymer comprising more ethylene 30 than vinyl acetate.

One preferred example is the WaterProof® Transfer Sheet sold by DuPont under Stock #G06086 having coated thereon a polycaprolactone or poly(vinylacetate) layer wherein one of the layers has been modified to contain a light attenuating agent. This image receiving layer can be present in any amount effective for the intended purpose. In general, good results have been obtained at coating weights in the range of about 5 to about 150 $mg/dm^2$, typically about 20 to about 60 $mg/dm^2$.

As shown in FIG. 2*a,* in addition to the image receiving layer or layers described above, the receiver element (20*a*), may optionally include one or more other layers (23) between the receiver support and the image receiving layer. A useful additional layer between the image receiving layer and the support is a release layer (23). It is typical for the release layer to contain the light attenuating agent instead of the support. Alternately, the support and the release layer may both contain the light attenuating agent. The receiver support alone or the combination of receiver support and release layer is referred to as a first temporary carrier. The release layer can provide the desired adhesion balance to the receiver support so that the image-receiving layer adheres to the receiver support during exposure and separation from the thermally imageable element, but promotes the separation of the image receiving layer from the receiver support in subsequent steps. Examples of materials suitable for use as the release layer include polyamides, silicones, vinyl chloride polymers and copolymers, vinyl acetate polymers and copolymers and plasticized polyvinyl alcohols. The release layer can have a thickness in the range of about 1 to about 50 microns.

A cushion layer (23) which is a deformable layer may also be present in the receiver element, typically between the release layer and the receiver support. It too may contain the light attenuating agent. The cushion layer may be present to increase the contact between the receiver element and the thermally imageable element when assembled. Additionally, the cushion layer aids in the optional micro-roughening process by providing a deformable base under pressure and optional heat. Furthermore, the cushion layer provides excellent lamination properties in the final image transfer to a paper or other substrate. Examples of suitable materials for use as the cushion layer include copolymers of styrene and olefin monomers; such as, styrene/ethylene/butylene/styrene, styrene/butylene/styrene block copolymers, ethylene-vinylacetate and other elastomers useful as binders in flexographic plate applications. The cushion layer may have a thickness range from about 0.5 to about 5 mils (or higher). Typically, the light attenuating agent is introduced into the release or cushion layers by compounding the desired attenuating agent into a cushion or release layer polymeric material; such as, the type of polymers denoted above. To those skilled in the art, the compounding techniques can range from the use of Banbury mixers or two roll mills, melt extrusion via a single/twin screw extrusion equipment or solvent dispersion with high shear mixing. All these compounding techniques could be used; however, the preferred method for its ease and simplicity is melt extrusion.

Methods for optionally roughening the surface of the image receiving layer include micro-roughening. Micro-roughening may be accomplished by any suitable method. One specific example, is by bringing it in contact with a roughened sheet typically under pressure and heat. The pressures used may range from about 800+/−about 400 psi. Optionally, heat may be applied up to about 80 to about 88° C. (175 to 190° F.) more typically about 54.4° C. (130° F.) for polycaprolactone polymers and about 94° C. (200° F.) for poly(vinylacetate) polymers, to obtain a uniform micro-roughened surface across the image receiving layer. Alternatively, heated or chilled roughened rolls may be used to achieve the micro-roughening.

It is typical that the means used for micro-roughening of the image receiving layer has a uniform roughness across its surface. Typically, the means used for micro-roughening has an average roughness (Ra) of about 1$\mu$ and surface irregularities having a plurality of peaks, at least about 20 of the peaks having a height of at least about 200 nm and a diameter of about 100 pixels over a surface area of about 458$\mu$ by about 602$\mu$.

The roughening means should impart to the surface of the image receiving layer an average roughness (Ra) of less than about 1$\mu$, typically less than about 0.95$\mu$, and more typically less than about 0.5$\mu$, and surface irregularities having a plurality of peaks, at least about 40 of the peaks, typically at least about 50 of the peaks, and still more typically at least about 60 of the peaks, having a height of at least about 200 nm and a diameter of about 100 pixels over a surface area of about 458$\mu$ by about 602$\mu$ These measurements are made using Wyco Profilometer (Wyko Model NT 3300) manufactured by Veeko Metrology, Tucson, Ariz.

The outermost surface of the receiver element may further comprise a gloss reading of about 5 to about 35 gloss units, typically about 20 to about 30 gloss units, at an 85° angle. A GARDCO 20/60/85 degree NOVO-GLOSS meter manufactured by The Paul Gardner Company may be used to take measurements. The glossmeter should be placed in the same orientation for all readings across the transverse direction orientation.

The topography of the surface of the image receiving layer may be important in obtaining a high quality final image with substantially no micro-dropouts.

The receiver element is typically an intermediate element in the process of the invention because the laser imaging step is normally followed by one or more transfer steps by which the exposed areas of the thermally imageable layer are transferred to the permanent substrate.

Permanent Substrate

One advantage of the process of this invention is that the permanent substrate for receiving the colorant-containing image can be chosen from almost any sheet material desired. For most proofing applications a paper substrate is used, typically the same paper on-which the image will ultimately be printed. Most any paper stock can be used, is an example is LOE paper. Other materials which can be used as the permanent substrate include cloth, wood, glass, china, most polymeric films, synthetic papers, thin metal sheets or foils, etc. Almost any material which will adhere to the image receiving layer or adhesive layer applied theretocan be used as the permanent substrate.

Autofocus Process Steps

The process for adjusting the energy of an imaging laser for imaging a thermally imageable element comprises the steps of:

(a) providing an imaging unit having a non-imaging laser and an imaging laser, the non-imaging laser having a light detector which is in communication with the imaging laser;

(b) contacting a receiver element with the thermally imageable element in the imaging unit, wherein the receiver element comprises a light attenuating agent-containing layer having a front surface and a back surface;

(c) actuating the non-imaging laser to expose the thermally imageable element and the receiver element to an amount of light energy sufficient for the light detector to detect the amount of light reflected from the thermally imageable element and the light attenuating agent-containing layer of the receiver element, whereby light reflected from interfaces beyond the back surface of the light attenuating agent-containing layer is substantially reduced and is substantially dominated by the light reflecting from the thermally imageable element and light attenuating agent-containing layer into the light detector; and d) actuating the imaging laser to properly focus the imaging laser in order to expose the thermally imageable element to an amount of light energy sufficient for imaging the thermally imageable element, the focus of light energy being determined by the amount of light reflected from the thermally imageable element and the light attenuating agent-containing layer and communicated to the imaging laser by the light detector.

The imaging unit has a non-imaging laser and an imaging laser, the non-imaging laser having a light detector which is in communication with the imaging laser. Typically the non-imaging laser emits in about the 300 nm to about the 11500 nm region. The non-imaging laser is not used to image the thermally imageable element, and is therefore constantly operational prior to and during imaging for focussing the imaging laser thereby adjusting the energy to the imaging laser for the imaging step. In one embodiment, the non-imaging laser may emit in the 670 nm region and the imaging laser may emit in about the 750 to 850 nm region. The light attenuating agent used in a layer of the receiver element has been found to be particularly useful for imaging certain pigmented thermally imageable elements (e.g. those substantially transparent to 670 nm radiation) such as yellow and magenta. An example of a non-imaging laser is the Toshiba (Japan) 10 mW, 670 nm visible light laser diode. Suitable imaging lasers may be obtained from Spectra Diode Laboratries, San Jose, Calif. or Sanyo Electric Co., Osaka, JP. These may be used as part of a laser-spatial light modulator system such as that disclosed in U.S. Pat. No. 5,517,359, or electrically modulated directly as disclosed in U.S. Pat. No. 4,743,091. Some typically used light detectors, also known as position sensitive detectors include monolithic Silicon detectors comprising 2, 4, or a similar number of elements arrayed such that the portion of reflected beam on each segment can be measured, and the relative position of a feature such as the center of the beam can be determined. Suitable light detectors may be obtained from United Detector Technology (U.S.A.). Alternately, the position of the beam could be determined from a sensor having greater than 4 elements, such as a CCD or CMOS sensor having 1024 to 10,000,000 elements, as used in television image inspection systems. An example is the KAF-0400 from Eastman Kodak Co., Rochester, N.Y. One example of an imaging unit is that disclosed in U.S. Pat. No. 6,137,580.

As shown in FIGS. 3 and 4, the optional carrier element (71), the receiver element (20) having the light attenuating layer, and the thermally imageable element (10) are positioned over a drum (70) which is part of an imaging unit. One example of an imaging unit is the CREO Spectrum Trendsetter which utilizes a loading cassette. The optional carrier element may have a series of holes along the edges of the element as shown to assist in the drawing of a vacuum prior to the imaging step. The thermally imageable element (10), and the receiver element (20) may be loaded into the cassette in this order with an interleaving sheet present between each of the specified elements. At least one additional thermally imageable element (10), may also be loaded into the cassette.

As shown in FIGS. 5, 6 and 7, after contact of the thermally imageable element and the receiver element is achieved, the probe beam light (40) from the non-imaging laser is emitted in the direction of the sandwich formed by the optional carrier element (71), the receiver element (20) and the thermally imageable element (10).

As shown in FIG. 5, wherein the receiver element does not comprise a light attenuating layer, the light reflected off the back surface of the thermally imageable element and seen by light detector (50) is depicted by (41), the light reflected off the receiver element is depicted as (42), and the light reflected off the carrier element is depicted as (43). Those skilled in the art will recognize that each of these reflections may be comprised of individual reflections produced at each interface where the optical properties change, and each reflection will have wavelength dependant amplitude and phase. (51) represents multiple reflected spots from the thermally imageable element (10), the receiver element (20) and the optional carrier element (71) onto the light detector (50).

As shown in FIG. 6, wherein the receiver element comprises a light attenuating layer containing an absorber, the light reflected off the carrier element depicted as (43) is substantially reduced. As shown in FIG. 7, wherein the receiver element comprises a light attenuating layer containing a diffuser, the light reflected off the carrier element depicted as (43) is diffused as depicted by **(43*a*) through (43*e*)**.

The light detector, typically a position sensitive detector and its associated electronics and optional processing computer determines the position of the plane onto which to focus the imaging laser light based on these varying signals from the reflected light as the sandwich moves under the imaging system which includes the imaging laser. This determination of the optimum focus position is then communicated to the imaging laser.

The focus position is the distance in microns that the imaging laser beam travels into the thermally imageable element (color donor structure). The distance is measured starting from the outermost surface of the thermally imageable element and ending at the point where the beam reaches either the surface of the metal layer (if present) or the surface of the colorant-containing layer which is closest to the laser. The distance is measured empirically by imaging equipment software. This distance may not correspond exactly to the thicknesses of the layers of the thermally imageable element as measured by conventional means such as, a micrometer, because the laser beam does not travel perpendicular to the thermally imageable element. There can be some variation in focus positions for a given set of films as the imaging laser source ages and when films of the same color have different thicknesses because of non-uniformity of the thicknesses of the layers making up the thermally imageable element. The imaging laser is then actuated to focus the imaging laser in order to expose the thermally imageable element to an amount of light energy sufficient for imaging the thermally imageable element, the focus of light energy being determined by the amount of light reflected from the light attenuated layer of the thermally imageable element and the receiver element and communicated to the imaging laser by the light detector. Where one or more of the reflected non-imaging beams is spurious or otherwise makes determination of the position of the media sandwich erroneous or indeterminate, focusing errors of the imaging beam can occur. Elimination or reduction of reflected light from the interfaces beyond the light attenuated layer have been found to improve the accuracy of determining the proper focusing position for the imaging laser.

The imaging laser is then actuated to focus the imaging laser in order to expose the thermally imageable element to an amount of light energy sufficient for imaging the thermally imageable element, the focus of light energy being determined by the amount of light reflected from the thermally imageable element and the light attenuating agent-containing layer and communicated to the imaging laser by the light detector. Where one or more of the reflected non-imaging beams is spurious or otherwise makes determination of the position of the media rroneous or indeterminate, focusing errors of the imaging beam can occur. Elimination or reduction of reflected light from the interfaces beyond the light attenuating agent-containing layer have been found to improve the accuracy of determining the proper focusing position for the imaging laser.

Imaging Process Steps

Exposure:

The first step in the process of the invention is imagewise exposing the laserable assemblage to laser radiation. The exposure step is typically effected with an imaging laser at a laser fluence of about 600 mJ/cm$^2$ or less, most typically about 250 to about 440 mJ/cm$^2$. The laserable assemblage comprises the thermally imageable element and the receiver element.

The assemblage is normally prepared following removal of a coversheet(s), if present, by placing the thermally imageable element in contact with the receiver element such that thermally imageable layer actually touches the image receiving layer on the receiver element. Vacuum and/or pressure can be used to hold the two elements together. As one alternative, the thermally imageable and receiver elements can be held together by fusion of layers at the periphery. As another alternative, the thermally imageable and receiver elements can be taped together and taped to the imaging apparatus, or a pin/clamping system can be used. As yet another alternative, the thermally imageable element can be laminated to the receiver element to afford a laserable assemblage. The laserable assemblage can be conveniently mounted on a drum to facilitate laser imaging. Those skilled in the art will recognize that other engine architectures such as flatbed, internal drum, capstan drive, etc. can also be used with this invention.

Various types of lasers can be used to expose the laserable assemblage. The laser is typically one emitting in the infrared, near-infrared or visible region. Particularly advantageous are diode lasers emitting in the region of about 750 to about 870 nm which offer a substantial advantage in terms of their small size, low cost, stability, reliability, ruggedness and ease of modulation. Diode lasers emitting in the range of about 780 to about 850 nm are most typical. Such lasers are available from, for example, Spectra Diode Laboratories (San Jose, Calif.). One preferred device used for applying an image to the image receiving layer is the Creo Spectrum Trendsetter 3244P, which utilizes lasers emitting near 830 nm. This device utilizes a Spatial Light Modulator to split and modulate the 5–50 Watt output from the ~830 nm laser diode array. Associated optics focus this light onto the imageable elements. This produces 0.1 to 30 Watts of imaging light on the donor element, focused to an array of 50 to 240 individual beams, each with 10–200 mW of light in approximately 10×10 to 2×10 micron spots. Similar exposure can be obtained with individual lasers per spot, such as disclosed in U.S. Pat. No. 4,743,091. In this case each laser emits 50–300 mW of electrically modulated light at 780–870 nm. Other options include fibre coupled lasers emitting 500–3000 mW and each individually modulated and focused on the media. Such a laser can be obtained from Opto Power in Tucson, Ariz.

Optical imaging systems can be constructed based on any of these laser options. In each system, focus of the imaging laser can be determined manually or automatically. A common autofocus approach utilizes a separate non-imaging laser incident on the desired imaging plane and reflected into a sensor. There are many approaches to the design of this autofocus system, but they can be incorporated into imaging systems based on any exposure laser source.

The exposure may take place through the optional ejection layer or subbing layer and/or the heating layer of the thermally imageable element. The optional ejection layer or subbing layer or the receiver element having a roughened surface, must be substantially transparent to the laser radiation. The heating layer absorbs the laser radiation and assists in the transfer of the thermally imageable material. In some cases, the ejection layer or subbing layer of the thermally imageable element will be a film that is transparent to infrared radiation and the exposure is conveniently carried out through the ejection or subbing layer. In other cases, these layers may contain laser absorbing dyes which aid in material transfer to the image receiving element.

The laserable assemblage is exposed imagewise so that the exposed areas of the thermally imageable layer are transferred to the receiver element in a pattern. The pattern itself can be, for example, in the form of dots or line work generated by a computer, in a form obtained by scanning artwork to be copied, in the form of a digitized image taken from original artwork, or a combination of any of these forms which can be electronically combined on a computer prior to laser exposure. The laser beam and the las rable assemblage are in constant motion with respect to each other, such that each minute area of the assemblage, i.e., "pixel" is individually addressed by the laser. This is generally accomplished by mounting the laserable assemblage on a rotatable drum. A flat bed recorder can also be used.

Separation:

The next step in the process of the invention is separating the thermally imageable element from the receiver element. Usually this is done by simply peeling the two elements apart. This generally requires very little peel force, and is accomplished by simply separating the thermally imageable support from the receiver element. This can be done using any conventional separation technique and can be manual or automatic without operator intervention.

Separation results in a laser generated color image, typically a halftone dot image, comprising the transferred exposed areas of the thermally imageable layer, being revealed on the image receiving layer of the receiver element. Typically the image formed by the exposure and separation steps is a laser generated halftone dot color image formed on a crystalline polymer layer, the crystalline polymer layer being located on a first temporary carrier which may or may not have a layer present directly on it prior to application of the crystalline polymer layer, wherein either the first temporary carrier or the optional layer that may be present directly on it comprise the light attenuating agent.

Additional Steps:

The so revealed image on the image receiving layer may then be transferred directly to a permanent substrate or it may be transferred to an intermediate element such as an image rigidification element, and then to a permanent substrate. Typically, the image rigidification element comprises a support having a release surface and a thermoplastic polymer layer.

The so revealed image on the image receiving layer is then brought into contact with, typically laminated to, the thermoplastic polymer layer of the image rigidification element resulting in the thermoplastic polymer layer of the rigidification element and the image receiving layer of the receiver element encasing the image. A WaterProof® Laminator, manufactured by DuPont is preferably used to accomplish the lamination. However, other conventional means may be used to accomplish contact of the image carrying receiver element with the thermoplastic polymer layer of the rigidification element. It is important that the adhesion of the rigidification element support having a release surface to the thermoplastic polymer layer be less than the adhesion between any other layers in the sandwich. The novel assemblage or sandwich is highly useful, e.g., as an improved image proofing system. The support having a release surface may then removed, typically by peeling off, to reveal the thermoplastic film. The image on the receiver element may then be transferred to the permanent substrate by contacting the permanent substrate with, typically laminating it to, the revealed thermoplastic polymer layer of the sandwich. Again a WaterProof® Laminator, manufactured by DuPont, is typically used to accomplish the lamination. However, other conventional means may be used to accomplish this contact.

Another embodiment includes the additional step of removing, is typically by peeling off, the receiver support resulting in the assemblage or sandwich comprising the permanent substrate, the thermoplastic layer, the image, and the image receiving layer. In a more typical embodiment, these assemblages represent a printing proof comprising a laser generated halftone dot color thermal image formed on a crystalline polymer layer, and a thermoplastic polymer layer laminated on one surface to said crystalline polymer layer and laminated on the other surface to the permanent substrate, whereby the color image is encased between the crystalline polymer layer and the thermoplastic polymer layer.

Formation of Multicolor Images:

In proofing applications, the receiver element can be an intermediate element onto which a multicolor image is built up. A thermally imageable element having a thermally imageable layer comprising a first pigment is exposed and separated as described above. The receiver element has an image formed with the first pigment, which is typically a laser generated halftone dot color thermal image. Thereafter, a second thermally imageable element having a thermally imageable layer different than that of the first thermally imageable element forms a laserable assemblage with the receiver element having the image of the first pigment and is imagewise exposed and separated as described above. The steps of (a) forming the laserable assemblage with a thermally imageable element having a different pigment than that used before and the previously imaged receiver element, (b) exposing, and (c) separating are sequentially repeated as often as necessary in order to build the multi-colorant-containing image of a color proof on the receiver element. The image on the receiver therefore changes as the image is built up, and the transmission of this image at the wavelength of the non-imaging laser changes as the process is repeated. Light passing through this image and reflected into the light detector, typically a position sensitive light detector, causes imaging errors, which are greatly reduced by the light attenuating agent-containing layer in the receiver.

The rigidification element may then be brought into contact with, typically laminated to, the multiple colorant-containing images on the image receiving element with the last colorant-containing image in contact with the thermoplastic polymer layer. The process is then completed as described above.

EXAMPLES

These non-limiting examples demonstrate the processes and products described herein wherein images of a wide variety of colors are obtained. All percentages are weight percentages unless indicated otherwise.

Glossary

| | |
|---|---|
| SDA | 2-[2-[2-Chloro-3[2-(1,3-dihydro-1,1dimethyl-3-(4dimethyl-3(4sulfobutyl)-2H-benz[e]indol-2-yllidene)ethylidene]-1-cyclohexen-1-yl]ethenyl]-1,1-dimethyl-3-(sulfobutyl)-1H-benz[e]indolium, inner salt, free acid SDA 4927 Infrared dye [CAS No. 162411-28-1] (H. W. Sands Corp., Jupiter, FL) |
| FSA | Zonyl ® FSA fluoro surfactant; 25% solids in water and isopropanol, [CAS No. 57534-45-7] A lithium carboxylate anionic fluorosurfactant having the following structure: RfCH2CH2SCH2CH2CO2Li where Rf = F(CF2CF2)x and where x = 1 to 9 (DuPont, Wilmington, DE) |
| FSD | Zonyl ® FSD fluoro surfactant; 43% active ingredient in water (DuPont, Wilmington, DE) |
| RCP-26735 | Methylmethacrylate/n-butylmethacrylate (76/24) copolymer latex emulsion at 37.4% solids (DuPont, Wilmington, DE). |
| PEG 6800 | Polyethylene glycol 6800 [CAS No. 25322-68-3], 100%, Scientific Polymer Products, Inc., Ontario, NY) |
| DF110D | Surfynol ® DF110D (Air Products) |
| Zinpol ® 20 | Zinpol ® 20, Polyethylene wax emulsion, 35% in water (B. F. Goodrich Company) |
| Melinex ® 573 | 4 mil clear PET base (DuPontTeijinFilms ™, a joint venture of E. I. du Pont de Nemours & Company) |
| Melinex ® 6442 | 4 mil PET base with 670 nm dye absorber (DuPontTeijinFilms ™, a joint venture of E. I. du Pont de Nemours & Company) Dye is CAS # 12217-80-0 1H-Naphth[2,3-f]isoindole- |

-continued

| | |
|---|---|
| | 1,3,5,10(2H)-tetrone, 4,11-diamino-2-(3-methoxypropyl)-(9CI) (CA INDEX NAME) |
| 30S330 | Green Shade Phthalo Blue Waterborne Dispersion 40% solids (Penn Color, Inc., Doylestown, PA) |
| 32Y144D | Green Shade Yellow Waterborne Dispersion 41% solids (Penn Color, Inc., Doylestown, PA) |
| 32Y145D | Red Shade Yellow Waterborne Dispersion 40% solids (Penn Color, Inc., Doylestown, PA) |
| 32R164D | Red 32R164D pigment dispersion; 40% in water (Penn color, PA) |
| 32S168D | Violet 32S168D pigment dispersion; 41% in water (Penn Color, PA) |
| 32S187D | Blue32S187D pigment dispersion; 40% in water (Penn Color, PA) |
| Water-Proof ® | Thermal Halftone Proofing System - 4 Page size Transfer Sheet Stock Number H74900 (aka Receiver) IRL Film Stock Number H71103 Donor Film Black Stock Number H71073 Donor Film Magenta Stock Number H71022 |

Example 1

Preparation of the Thermally Imageable Compositions

This example shows the preparation of a 670 nm absorbing coatable composition and a thermally imageable element. The thermally imageable element comprises a 4 mil polyester backing (Melinex® 573) sputtered with about 70 Å of chromium, sufficient to produce about 60% transmission of light, by CP Films (Martinsville, Va.). The metal thickness was monitored in situ using a quartz crystal and after deposition by measuring reflection and transmission of the films. This metalized base was then coated with a solution of the magenta formula depicted in Table 1 using production equipment.

TABLE 1

Recipes for colorant-containing compositions:

| Ingredient | Magenta | Yellow | Cyan |
|---|---|---|---|
| Deionized Water | 12,294 | 18,050 | 15,433 |
| RCP 26735 | 4,326 | 4,133 | 6,941 |
| 32R164D | 1,526 | | |
| 32S168D | 19.2 | | |
| 32Y144D | | 1,321 | |
| 32Y145D | | 257.7 | |
| 30S330 | | | 1,259 |
| 32S187D | | | 160.2 |
| PEG | 146.3 | 153.8 | 135.4 |
| SDA 4927 | 53.2 | 48.1 | 50.7 |
| DF110D | | 12.2 | |
| FSA | 26.6 | 24.2 | 19.5 |
| TOTAL (grams) | 19,000 | 24,000 | 24,000 |

TABLE 2

Recipe for 670 nm absorbing coating:

| Ingredient | Absorber |
|---|---|
| Distilled Water | 129.7 |
| RCP 26735 | 59.4 |
| 30S330 | 9.5 |
| PEG | 1.1 |
| FSD | 0.3 |
| TOTAL (grams) | 200.0 |

The results in Table 3 compares images made with the magenta element containing a 670 nm absorbing back side coating (the back side coating was on the side of the base element opposite that of the magenta colorant-containing layer) with those made with the 670 nm absorbing back side coating on the receiver (the back side coating was on the side of the receiver support opposite that of the image receiving layer). The focus positions when the receiver contained the 670 nm absorbing back side coating were the same for single colors and overprints. The focus positions varied when the magenta element had a back side coating of the 670 nm absorber. The images made from a magenta element and a receiver which both lacked the absorber had different focus positions for single color and overprints indicating that the 670 nm focusing laser was not able to find the same focus point despite using equivalent magenta elements.

Focus position data used in these examples was collected from the computer diagnostic port of the Creo 3244 Spectrum Trendsetter.

TABLE 3

Focus position on Magenta Element and Receiver

| | | Magenta Element | | | Receiver | | |
|---|---|---|---|---|---|---|---|
| Wire Rod # | Coating weight mg/dm | Absorbance 670 nm | Single Color | Over-Print | Absorbance 670 nm | Single Color | Over-print |
| 5 | 6.1 | .33 | 60 | 70 | .30 | 60 | 60 |
| 6 | 9.2 | .40 | 65 | 80 | .40 | 60 | 60 |
| 7 | 12.5 | .44 | 70 | 80 | .64 | 60 | 60 |
| Control | | | 30 | 60 | | | |

*Control sample is a Magenta element without the back side coating of a 670 nm absorber.

What is claimed is:

1. A process for adjusting the focus of an imaging laser for imaging of a thermally imageable element comprises the steps of:

(a) providing an imaging unit having a non-imaging laser and an imaging laser, the non-imaging laser having a light detector which is in communication with the imaging laser;

(b) contacting a receiver element with the thermally imageable element in the imaging unit, wherein the receiver element comprises an image receiving layer and a light attenuating layer;

(c) actuating the non-imaging laser to expose the thermally imageable element and the receiver element to an amount of light energy sufficient for the light detector to detect the amount of light reflected from the thermally imageable element and the light attenuating layer of the receiver element; and (d) actuating the imaging laser to properly focus the imaging laser in order to expose the thermally imageable element to an amount of light energy sufficient for imaging the thermally imageable element, the focus of light energy being determined by the amount of light reflected from the thermally imageable element and the light attenuating layer and communicated to the imaging laser by the light detector.

2. The process of claim 1 wherein the image receiver further comprises an image receiving layer present on the front surface of the light attenuating layer.

3. The process of claim 2 wherein the light attenuating layer is a release layer, support layer, cushion layer or a backing layer.

4. The process of claim 3 wherein the light attenuating agent is selected from an absorber, a diffuser and mixtures thereof.

5. The process of claim 4 wherein the absorber is a blue phthalocyanine pigment.

6. The process of claim 4 wherein the absorber is carbon black.

7. The process of claim 4 wherein the diffuser is titanium dioxide.

8. The process of claim 4 wherein the light attenuating agent is a mixture of a diffuser and an absorber.

9. The process of claim 8 wherein the light attenuating agent is a mixture of a blue phthalocyanine pigment and titanium dioxide.

10. The process of claim 3 wherein the light attenuating agent is selected from the group consisting of an absorber, a diffuser and mixtures thereof.

11. The process of claim 1 wherein the thermally imageable element comprises a pigment.

12. The process of claim 1 wherein the non-imaging laser emits in about the 300 nm to about the 1500 nm region.

13. The process of claim 1 wherein the imaging laser emits in about the 750 nm to about the 850 nm region.

14. The process of claim 1 further comprising the steps of:

(a) imaging the thermally imageable element to form imaged area and non-imaged area; and (b) separating the imaged thermally imageable element from the receiver element to form an image on the image receiving layer of the receiver element.

15. The process of claim 14 wherein the imaged area is formed by transfer of a pigment particle.

16. The process of claim 1 wherein the non-imaging laser emits at a wavelength of about 670 nm.

17. The process of claim 1 wherein the imaging laser emits at a wavelength of about 830 nm.

* * * * *